United States Patent [19]

French

[11] Patent Number: 5,017,920
[45] Date of Patent: May 21, 1991

[54] HIGH-SPEED MODIFIED SUCCESSIVE APPROXIMATION ANALOG TO DIGITAL CONVERTER

[75] Inventor: Barry T. French, Fullerton, Calif.

[73] Assignee: Rockwell International Corporation, El Segundo, Calif.

[21] Appl. No.: 347,703

[22] Filed: May 5, 1989

[51] Int. Cl.$^5$ ............................................. H03M 1/40
[52] U.S. Cl. .................................... 341/163; 341/161; 341/162
[58] Field of Search ............... 341/155, 156, 158, 161, 341/162, 163

[56] References Cited

U.S. PATENT DOCUMENTS

| | | | |
|---|---|---|---|
| 3,599,204 | 8/1971 | Severin | 341/162 |
| 3,936,820 | 2/1976 | Goldstone et al. | 341/162 |
| 4,684,924 | 8/1987 | Wood | 341/156 |
| 4,745,394 | 5/1988 | Cornett | 341/158 |

FOREIGN PATENT DOCUMENTS

| | | | |
|---|---|---|---|
| 23322 | 2/1982 | Japan | 341/161 |
| 7610299 | 3/1978 | Netherlands | 341/161 |

Primary Examiner—A. D. Pellinen
Assistant Examiner—Howard L. Williams
Attorney, Agent, or Firm—H. Fredrick Hamann; George A. Montanye; David J. Arthur

[57] ABSTRACT

A high-speed algorithmic successive approximation analog to digital converter includes a system input terminal, and a tri-state comparator having an input terminal connected to the signal sampler. The comparator produces a first indication of a signal on its input terminal exceeds an upper reference voltage and the comparator produces a second indication if a signal on its input terminal exceeds the lower reference voltage, and does not exceed the upper reference voltage. A subtractor is connected to the system input terminal and to the comparator for subtracting from a received signal a first value corresponding to the upper reference voltage if the comparator produces the first indication, or a second value corresponding to the lower reference voltage if the comparator produces the second indication. The system additionally includes a multiplier having an input terminal connected to the output of the subtractor for doubling the output of the subtractor for further processing by the same or similar comparator assemblies. The comparator preferably includes first and second comparators, each for comparing the signal input with one of the upper and lower reference voltages, and logic connected to the output terminals of the comparators for producing the second indication only if the first indication is not produced.

29 Claims, 4 Drawing Sheets

FIG.1 ALGORITHMIC ADC

FIG.4 COMPARATOR

HIGH-SPEED MODIFIED SUCCESSIVE APPROXIMATION ANALOG TO DIGITAL CONVERTER

The invention herein described was made in the course of and/or under Contract No. DASG60-86-C-0095 with the Department of the Army.

BACKGROUND OF THE INVENTION

Analog to digital conversion is often performed using an algorithmic analog to digital converter (ADC). Algorithmic ADC's generally require a minimum of circuitry. The present invention is particularly concerned with ADC's useful in conjunction with focal plane arrays for detecting infrared radiation. Such focal planes are used in spacecraft, which operates in very cold (10K) environments. Each focal plane array includes a large number of individual detectors. The output of each detector generally must be converted to a digital signal for processing. Therefore, a large number of ADC's are required, dictating that the ADC's occupy minimal space and consume minimal power.

Figure 1:
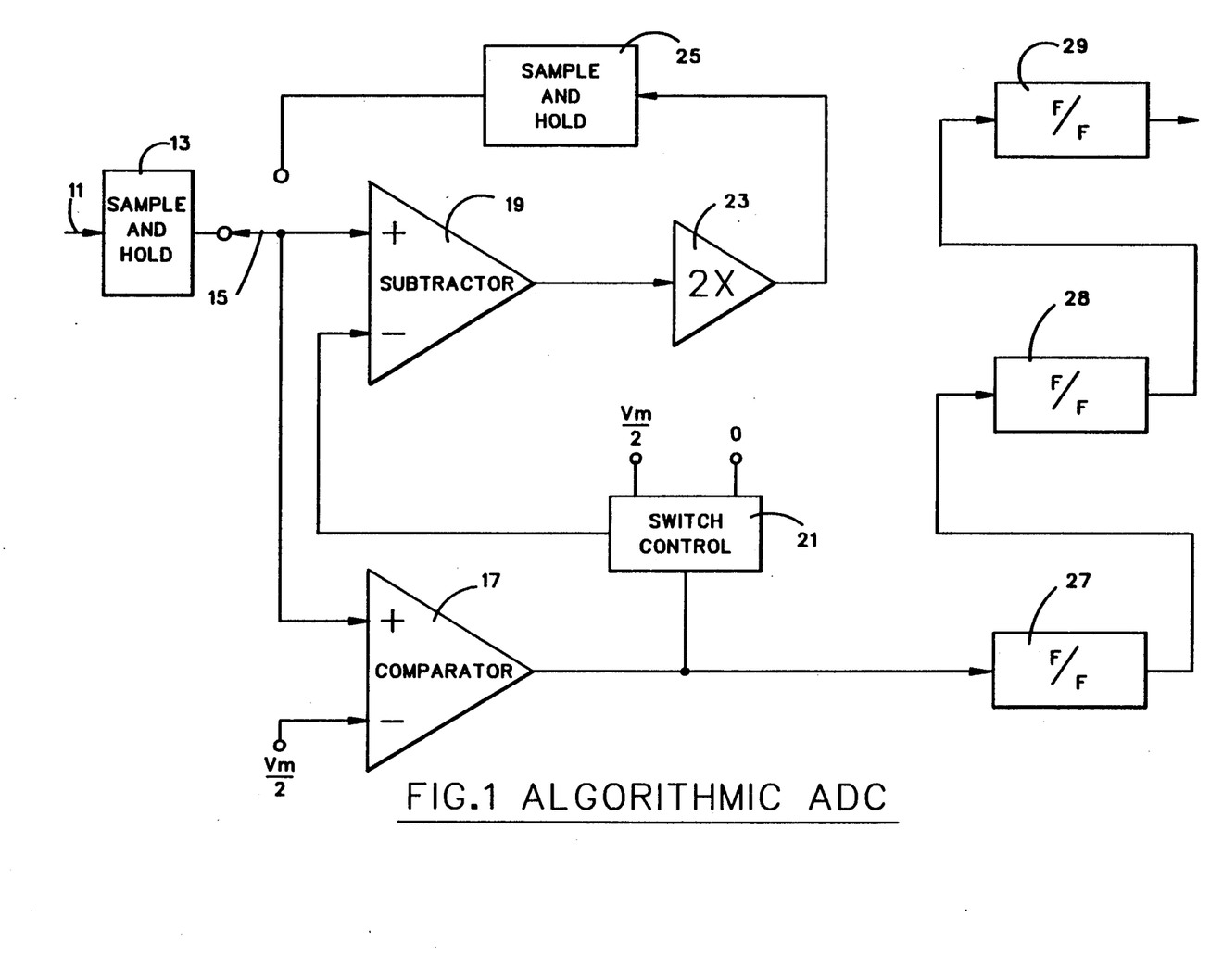
FIG. 1 illustrates an algorithmic analog to digital converter of conventional construction.

An example of current algorithmic analog to digital converters is illustrated in FIG. 1. An analog signal is received on the signal input line or system input terminal 11. The analog input signal is sampled in sample and hold circuitry 13. A switch 15 connects the output terminal of the sample and hold circuit to an input terminal of a comparator 17 and to the positive input terminal of a subtractor 19.

The input analog signal is assumed to have a maximum value of Vm. The comparator 17 compares the input signal sample with a threshold voltage Vm/2. If the signal exceeds the threshold voltage, the comparator outputs a binary bit one (1).

A switch control 21 connected to the output of the comparator controls the value or voltage applied to the negative input terminal of the subtractor 19. The subtractor removes from the input analog signal a voltage or value corresponding to the threshold exceeded.

The switch control applies the appropriate voltage to the negative input terminal of the subtractor. If the comparator outputs a one, indicating that the threshold Vm/2 has been exceeded, the switch control applies the voltage Vm/2 to the negative input terminal of the subtractor. If the comparator outputs a zero, indicating that the threshold Vm/2 has not been exceeded, the switch control applies zero voltage to the negative input terminal of the subtractor, so that the output of the subtractor has the same amplitude as the input.

Thus, the most significant bit of the digital representation of the magnitude of the analog signal received on the system input terminal has been generated on the comparator output terminal.

The next most significant bit is generated by multiplying the output of the subtractor 19 by two in a multiplier 23, and repeating the above comparison step.

The switch 15 closes the connection between a sample and hold circuit 25 connected to the output terminal of the multiplier and the input of the comparator 17. The doubled output of the subtractor can then be compared with the threshold voltage Vm/2. The output of the comparator 17 (a binary one if the threshold voltage is exceeded, a binary zero if the threshold voltage is not exceeded) is the second most significant bit. The switch control 21 applies either the voltage Vm/2 or zero voltage to the negative input of the subtractor 19, so that the subtractor subtracts that voltage from the doubled previous subtractor output.

The third most significant bit is generated by repeating the above process, as is the fourth most significant bit.

The successive bits generated may be applied to an accumulator comprising a number of delay elements such as flip-flops 27, 28, and 29. Using the accumulator shown, a four-bit digital representation of the analog signal value received can be generated by accumulating the three bits in the delay elements, and then allowing the bits to be read out of the third flip-flop 29 in the order of most significant bit to least significant bit.

Each bit decision requires that the comparator 17 accurately determine whether the sample is above or below the threshold to within one-half the value of the least significant bit. As is known to those skilled in the art, the greater the accuracy of the comparator, the greater the time required for the comparator to settle and generate an output. Thus, while accomplishing the purpose of generating a digital representation of an input analog signal with a minimum of circuitry, the algorithmic analog to digital converter illustrated in FIG. 1 has its maximum conversion speed limited by the time necessary for the comparator to settle to one-half of the least significant bit, for each bit decision.

SUMMARY OF THE INVENTION

The present invention is an algorithmic successive approximation analog to digital converter and its associated method that reduces the unknown portion of the linear range by a factor of two during each step of the analog to digital conversion, but does not require a full accuracy initial determination of each bit.

The method of the invention includes sampling an input analog signal to produce an input signal sample, and comparing the sample with upper and lower reference voltages. A first indication is produced if the sample exceeds the upper reference voltage, and a second indication is produced if the sample exceeds the lower reference voltage. Preferably, the second indication is produced only if the first indication is not produced. A first value corresponding to the upper reference voltage is subtracted from the input sample if the first indication is produced, or a second value corresponding to the lower reference voltage is subtracted from the input sample if the second indication is produced, to generate a reduced sample. The reduced sample is doubled, and the steps repeated.

DETAILED DESCRIPTION OF THE PREFERRED EMBODIMENTS

Figure 2:
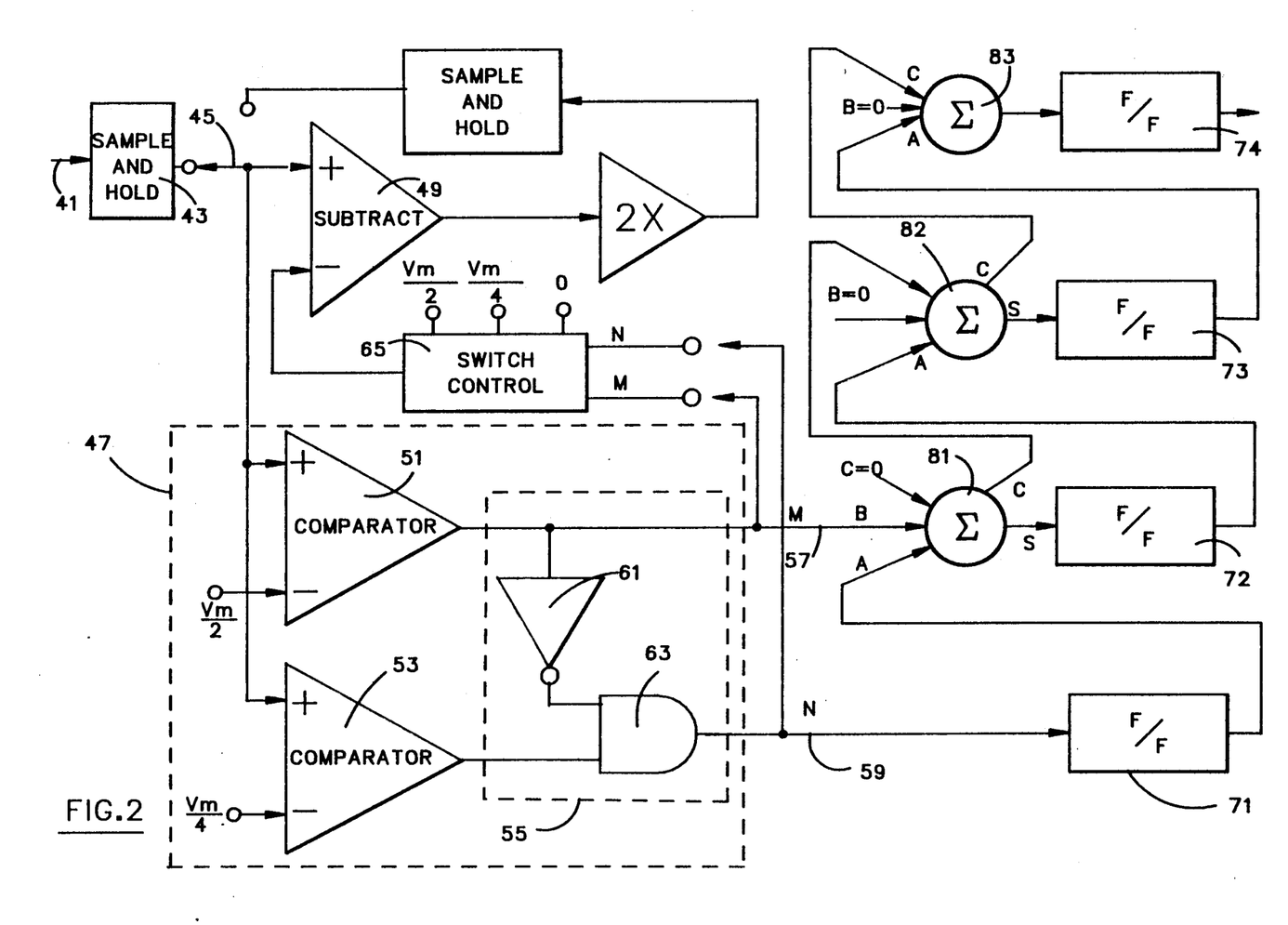
FIG. 2 illustrates one embodiment of an analog to digital converter constructed according to the invention.

Referring to FIG. 2, the illustrated embodiment uses somewhat more hardware than the conventional algorithmic analog to digital converter shown in FIG. 1, yet allows much faster operation because of the unique features of the invention. The bulk of this additional hardware is found in the accumulator, and is for refining the estimates made by the comparators.

A system input terminal 41 receives an analog signal, which is sampled in a sample and hold circuit 43. A switch 45 selectively connects that sample and hold circuit to the input terminal of a tri-state comparator 47 and the positive input terminal of a subtractor 49.

The tri-state comparator 47 can look at signals and compare them against a reference and provide three state results. When the signal definitely exceeds the reference voltage, the comparator produces a full binary bit one. When the input signal definitely does not exceed the reference voltage, a zero binary bit can be produced. And if no decision has been made because the signal and the reference are nearly the same value. a half bit or "undecided" output is produced.

The comparator 47 includes a pair of individual comparators 51, 53. The first comparator 51 compares the received signal sample with an upper threshold, such as $Vm/2$, and outputs a binary or digital bit one if the threshold $Vm/2$ is exceeded, and a zero if the threshold is not exceeded. The second comparator 53 compares the input received signal sample with a second threshold, lower than the first threshold, such as $Vm/4$, and outputs a one if the lower threshold is exceeded, and a zero if the lower threshold if not exceeded.

Logic 55 connected to the output terminals of the two comparators 51, 53 allows the full bit to appear on the full bit terminal 57 when the first comparator produces its output, and allows the half bit signal to appear on the half bit terminal 59 only when the second comparator 53 produces a positive output, and the first comparator 51 does not produce a positive output.

The logic shown is exemplary, and includes an inverter 61 connected to the output terminal of the first comparator 51, and an AND gate 63 having its input terminals connected to the output terminal of the inverter 61 and to the output terminal of the second comparator 53.

A subtractor 49 subtracts from the input sample a voltage corresponding to the threshold exceeded by the input sample. The subtractor has a positive terminal connected to the switch 45 that is selectively connected to the input sample and hold circuit or to a feedback loop. A negative input terminal to the subtractor is connected to a switch control 65 for applying to the subtractor negative input terminal the appropriate voltage.

The switch control 65 is connected to the half bit and full bit terminals 57, 59 and includes logic to place the appropriate voltage $Vm/2$, $Vm/4$, or zero on the switch control output, which is connected to the negative terminal of the subtractor. The switch control places the voltage $Vm/2$ on the subtractor input if the first comparator 51 indicates that the upper threshold $Vm/2$ is exceeded, or places the value $Vm/4$ on the subtractor input if the second comparator 53 indicates that the lower threshold $Vm/4$ is exceeded but the upper threshold is not exceeded. If neither threshold is exceeded, the zero value is connected to the subtractor negative input line.

The bits generated sequentially are accumulated in the accumulator attached to the full bit and half bit terminals of the comparator.

The accumulator includes a series of delay elements 71–74 and adders 81–83 for not only setting up the series of bits for output, but also to accommodate certain types of errors that may be made in the conversion process. The accumulator illustrated allows for the correction whenever the initial comparison produces a bit value that is lower than it should have been.

A first adder 81 in the accumulator receives an output from the full bit output terminal 57 and adds it to any previous half bit, which was stored in the first delay element or flip-flop 71, having been generated during a previous clock cycle if the signal sample exceeded the lower threshold $Vm/4$, but did not exceed the upper threshold $Vm/2$. The sum from the first adder is applied to another delay element or flip-flop 72, and the carry bit is carried forward to a second adder 82. The second adder combines this carry bit with the output from the second delay element 72. The sum from the second adder is stored in a third delay element 73, while its carry bit (if any) is applied to a third adder 83, which combines that carried bit with the output of the third flip-flop. The sum is output or applied to a fourth delay element 74.

Because the accumulator can increase the digital bit values, but not decrease them, it is preferable that the comparators be constructed so that if an error might be made, it be made by not triggering the comparator when it should have been, rather than triggering the comparator when it should not have been triggered. Because of the charge-up delay inherent in comparators, this will in most cases naturally result. When the sample significantly exceeds the threshold, the comparator will charge up rapidly to the threshold to output a binary one. If, however, the sample is closer to the threshold, the comparator will not slew to the threshold as rapidly. Thus, if the time allotted to the comparator for each comparison operation is limited, this comparator charge up delay will keep the comparator from generating a "one" output when the sample is not, in fact, greater than the reference voltage.

The structure of the invention and the refining of the accumulator eliminates the need for the comparator to settle to the full accuracy of one-half of the least significant bit, as the time necessary to do that in the case of an extreme voltage difference is lengthy. The invention takes advantage of the knowledge that the comparator has implicit information stored in it the instant it has the signal and reference voltages applied to its input terminals. If the signal and the reference are far apart, the comparator slews to an answer very rapidly.

Setting two comparators in parallel provides the tri-state comparator output with minimal decoding. This circuit provides fast output without the need for a single tri-state comparator having a "undecided" output.

With the references for the comparators set at or near $Vm/2$ and $Vm/4$, the two comparators can respond very rapidly. For slow operation, the comparator 47 picks out the full bit and half bit, and sends them to the accumulator, without error. For very fast operation, the comparator charge-up delay may shift the effective answer upward in value to some extent, but not a sufficient amount to induce an uncorrectable error in the full converter. Each comparator 51, 53 may automatically respond with an output that is not fully accurate, but whose error can be corrected by the correction and accumulator circuit. All that is required is that the error be less than plus or minus $Vm/4$ which means that the dynamic range is reduced by a factor of two.

To generate subsequent bits, the reference voltage is subtracted from the input sample by a subtractor, and the level of the remainder is boosted by a factor of two in a multiplier 85 on each successive pass through the comparison and subtraction process. The present invention places the primary accuracy burden on the multiplier 85, rather than on the comparator 47, as was the case in the ADC of FIG. 1.

For each successive comparison step using the invention, the accuracy requirement is reduced by a factor of two, until for the last step (generating the least significant bit), only about one part in four of the value must be accurately measured. The converter of the invention with the tri-state comparator permits each step in the chain to require equal accuracy. Hence, a single sample rate may suffice for all the measurement steps, which will permit pipelining the steps of the conversion to boost the speed of the entire analog to digital conversion function.

Figure 3:
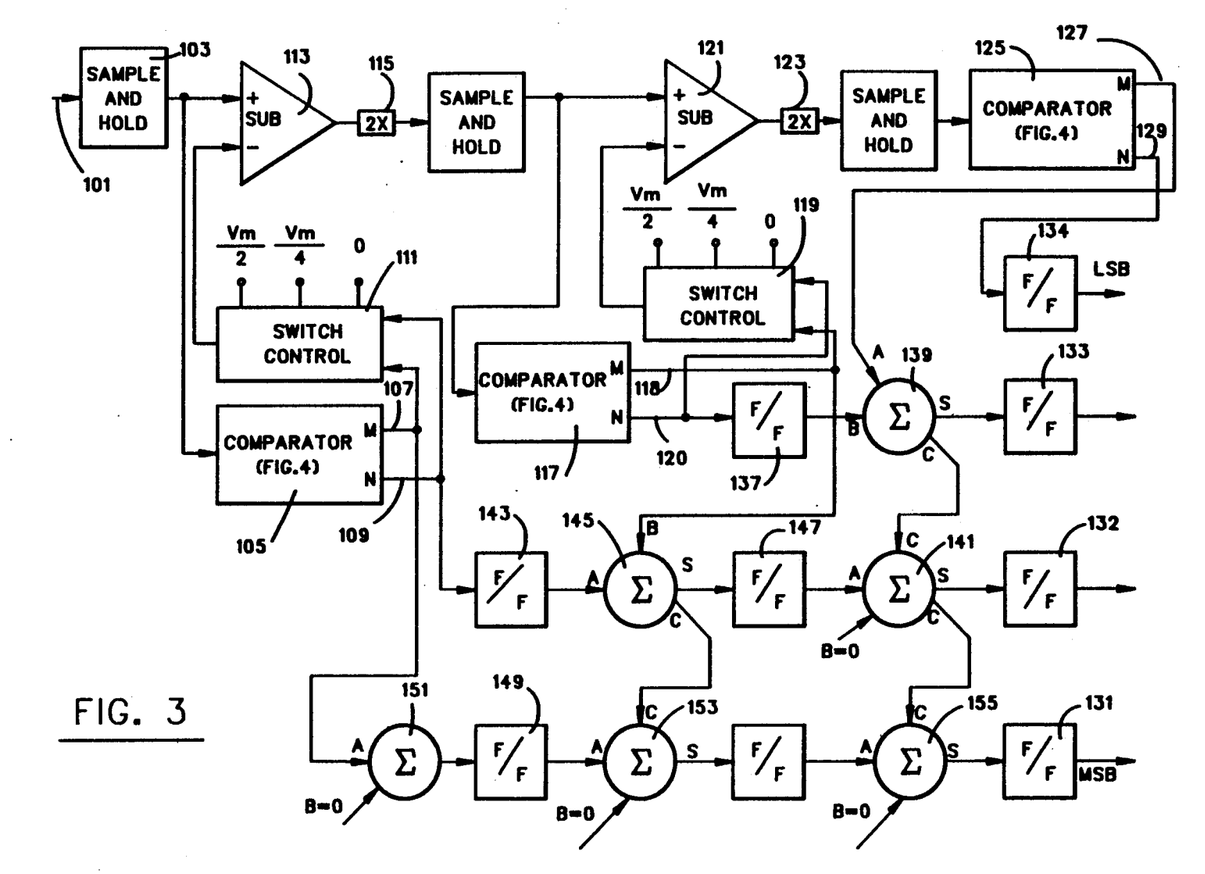
FIG. 3 illustrates a second embodiment of an analog to digital converter constructed according to the invention.

As mentioned, the converter of the invention is ideally suited to pipelining. Although a pipelined construction involves some additional hardware, the use of a pipelined construction can enormously increase the throughput speed of the analog to digital converter. The operation of the pipeline embodiment illustrated in FIG. 3 is substantially the same as that of the construction illustrated in FIG. 2, except that a series of comparison stages is provided, and additional accumulator circuitry is needed. The embodiment illustrated provides a four bit digital output in parallel.

An input analog signal is received on the system input terminal 101 and sampled in a sample and hold circuit 103. The input sample is applied to a tri-state comparator 105, such as the comparator illustrated in FIG. 4.

Figure 4:
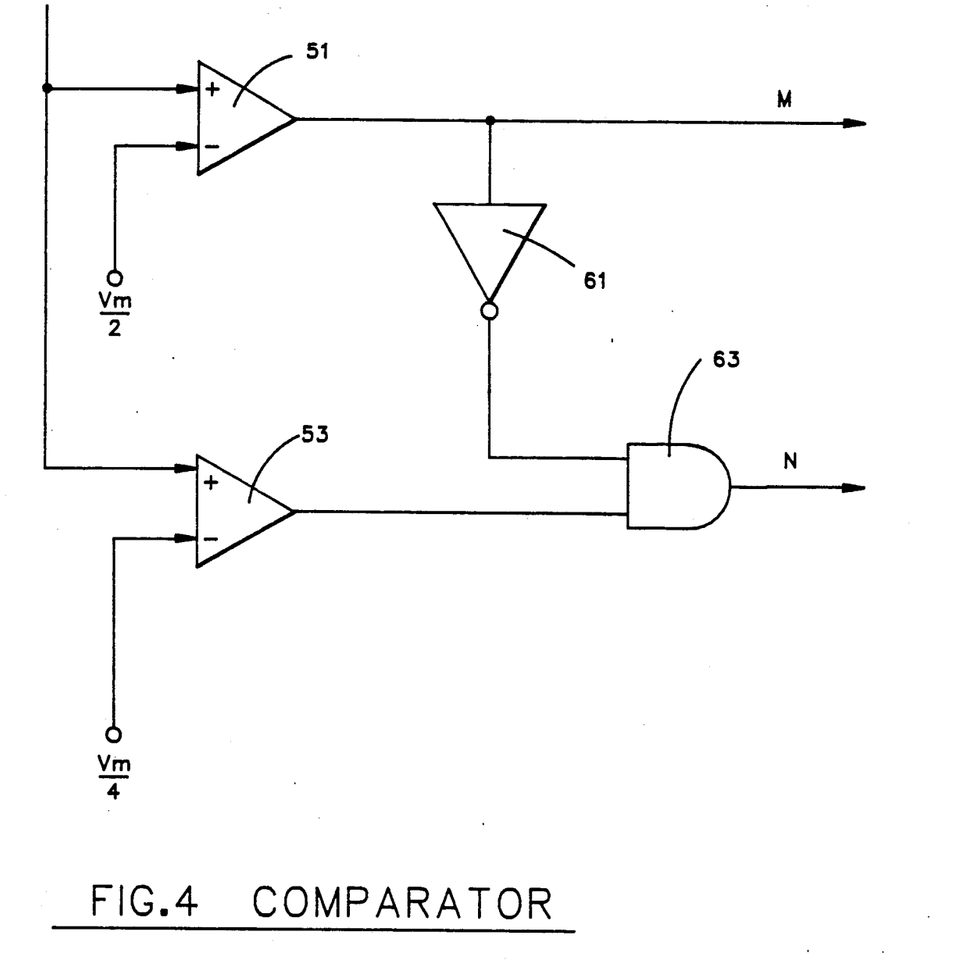
FIG. 4 illustrates a tri-state comparator useful in constructing the analog to digital converter of the invention.

The comparator illustrated in FIG. 4 is essentially the same as that used in the embodiment shown in FIG. 2, and thus the same reference numerals are used. The input sample is compared in the first comparator 51 with the upper reference threshold $Vm/2$ and in a second comparator 53 with a lower reference threshold $Vm/4$. If the input sample exceeds the upper reference voltage, the first comparator 51 outputs a binary bit one on the full bit line 57. If the input sample exceeds the second reference voltage $Vm/4$, the second comparator 53 outputs a binary bit one. Logic causes a zero to be produced on the half bit or next to most significant bit line 59 if the full bit signal is also produced on the full bit line 57.

The output terminals 107, 109 are connected to a first switch control 111, which causes a voltage corresponding to the bit signal produced by the comparator to be applied to the negative input of a subtractor 113. If a bit is produced on the full bit terminal 107; indicating that the input sample exceeded the upper reference voltage $Vm/2$, the voltage $Vm/2$ is applied to the negative input terminal of the subtractor 113. Similarly, if the bit is produced on the next most significant bit or half bit terminal 109, the switch control applies the voltage $Vm/4$ to the negative input terminal of the subtractor. If a one bit is produced on neither terminal 107, 109, indicating that the input signal exceeded neither the lower nor the upper reference threshold, zero voltage is applied by the switch control 111 to the negative input terminal of the subtractor.

The subtractor 113 subtracts the voltage applied from the switch control 111 from the analog input sample to produce a reduced sample. The reduced sample is doubled in a multiplier 115, and the doubled reduced sample is compared with the same reference voltages $Vm/2$ and $Vm/4$ in a second comparator 117, producing a second set of full and half bits on the full and half bit terminals 118, 120. These full and half bits control a second switch control 119, which selectively applies the voltage zero. $Vm/4$, or $Vm/2$ to the negative input terminal of a second subtractor 121.

The positive terminal of the second subtractor 121 receives the reduced multiplied sample. The output of the second subtractor then is a second reduced sample.

The second reduced sample is then multiplied by two in a second multiplier 123, and applied to a third comparator 125, which again compares the sample with the reference voltages $Vm/2$ and $Vm/4$ to produce a full bit signal on the terminal 127 if the second reduced sample exceeds the upper reference voltage, and producing a half bit or next to most significant bit on the terminal 129 if the lower threshold $Vm/4$ is exceeded, but the upper threshold $Vm/2$ is not.

An accumulator including a number of flip-flops and adders combines the various full bit and half bit output signals from the comparators and corrects for certain minor inaccuracies that may be introduced due to charge-up delay in the comparators. The accumulator also arranges for the four bits to be output in parallel.

A bank of output buffers 131-134 may provide the final stage for the bits forming the digital representation for the received analog signal sample. The half bit output N from the third or last comparator 125 may be applied to the delay element 134, and then output as the least significant bit of the digital representation of the input analog signal sample. The next least significant bit is the sum of the full bit M from the third comparator 125 and the {delayed}half bit signal from the second comparator 117, which has been delayed in a delay element 137. These two bit signals are combined in an adder 139. The sum from the adder is applied to the output stage delay element or flip-flop 133, while the carry bit is applied to another adder 141 that combines the carry bit with the sum from a previous adder stage.

The half bit output N from the first comparator 105 is delayed in a delay element 143, and combined in an adder 145 with the full bit output M of the second comparator 117. The sum of those two bits is delayed in a delay element 147, and applied to the second adder 141 which combines that sum with the carry bit from the combination produced by the first adder 139. The sum bit from that adder 141 is applied to the output stage delay element 132.

The full bit signal M on the full bit terminal 107 of the first comparator 105, which indicates that the initially received signal sample exceeded the upper reference threshold $Vm/2$ is delayed twice so it is in sync with the remainder of the bits produced in the system. The delays may be in a flip-flop 149 and an adder 151 having zero as the second input, or in a pair of flip-flops, or other time-delay elements. This most significant bit from the first comparator M is combined in a fourth adder 153 with the carry bit from the third adder 145. The sum is delayed and applied to a fifth adder 155 that combines that sum with the carry bit from the second adder 141, before applying the sum to the output stage delay element 131.

This accumulator causes the four bits of the digital representation of the signal to be produced simultaneously from the output stage delay elements 131-134.

The adders, with their carry output terminals, ensure that if an initial determination that the signal does not exceed the upper reference voltage is in error. That error can be corrected by combining subsequent comparison bits.

The above description has provided many details concerning the preferred embodiment of the present invention to enable those of ordinary skill in the art to construct the invention. Nevertheless, it will be apparent to those skilled in the art that many variations on the structure and in many of the specifics may be accomplished while still using the concepts of the invention. Thus, the scope of this patent is not limited to the preferred embodiments described above, but is limited only by the claims set forth below in the applicable laws relating to interpretation of those claims.

I claim:

1. A method of converting an input analog signal to a digital signal, comprising:
   sampling an input analog signal to produce an input signal sample;
   comparing said input signal sample with an upper reference voltage;
   producing a first indication if said sample exceeds said upper reference voltage;
   comparing said sample with a lower reference voltage that is a fraction of said upper reference voltage;
   producing a second indication if said sample exceeds said lower reference voltage;
   subtracting from said input sample a first value if said first indication is produced or a second value if said second indication is produced, to generate a reduced sample; and
   multiplying said reduced sample by a predetermined factor to generate a new sample.

2. The method of claim 1 wherein said predetermined factor is two.

3. The method of claim 1, wherein said step of producing said second indication comprises producing said second indication only if said first indication is not produced.

4. The method of claim 3 wherein:
   said first value is said upper reference voltage; and
   said second value is said lower reference voltage.

5. The method of claim 1 additionally comprising:
   comparing said new sample with said upper reference voltage;
   producing a third indication if said new sample exceeds said upper reference voltage;
   comparing said new sample with said lower reference voltage;
   producing a fourth indication if said new sample exceeds said lower reference voltage;
   subtracting from said new sample said first value if said third indication is produced or said second value if said fourth indication is produced to generate a second reduced sample;
   multiplying said second reduced sample by said predetermined factor to generate a second new sample;
   comparing said second new sample with said upper reference voltage;
   producing a fifth indication if said second new sample exceeds said upper reference voltage;
   comparing said second new sample with said lower reference voltage;
   producing a sixth indication if said second new sample exceeds said lower reference voltage.

6. The method of claim 5 wherein:
   said step of producing said second indication comprises producing said second indication only if said first indication is not produced;
   said step of producing said fourth indication comprises producing said fourth indication only if said third indication is not produced, and
   said step of producing said sixth indication comprises producing said sixth indication only if said fifth indication is not produced.

7. The method of claim 6 additionally comprising accumulating said first, second, third, fourth, fifth, and sixth indications.

8. The method of claim 5, additionally comprising:
   combining said third indication with said second indication to produce a first sum bit and a first carry bit; and
   combining said first carry bit with said first indication to produce a second sum bit.

9. An analog to digital converter comprising:
   a system input terminal;
   a signal sampler having an input terminal connected to said system input terminal, and having an output terminal;
   a tri-state comparator having an input terminal connected to said signal sampler, wherein:
      said comparator produces a first indication if a signal on its input terminal exceeds an upper reference voltage; and
      said comparator produces a second indication if said signal on its input terminal exceeds a predetermined fraction of said upper reference voltage;
   a subtractor connected to said signal sampler and to said comparator for subtracting from a signal output by said signal sampler a first value if said comparator produces said first indication, or a second value if said comparator produces said second indication, and
   a multiplier having an input terminal connected to the output of said subtractor.

10. The analog to digital converter of claim 9, wherein said comparator produces said second indication only if said comparator does not produce said first indication.

11. The analog to digital converter of claim 10, wherein:
   said tri-state comparator comprises a first output terminal and a second output terminal;
   said first indication comprises a bit on said first output terminal; and
   said second indication comprises a bit on said second output terminal.

12. The analog to digital converter of claim 11, additionally comprising:
   a second comparator having an input terminal connected to the output of said multiplier, for producing a third indication if the signal on said second comparator input terminal is above said upper reference voltage and for producing a fourth indication if the signal on said second comparator input terminal is above said lower reference voltage and below said upper reference voltage;
   a second subtractor connected to said multiplier and to said second comparator for subtracting from a signal produced by said multiplier said upper reference voltage if said third indication is produced, or said lower reference voltage if said fourth indication is produced, to produce a second reduced signal sample.

13. The analog to digital converter of claim 12, additionally comprising an accumulator connected to the output terminals of said first and second comparators.

14. The analog to digital converter of claim 13 wherein said accumulator comprises a plurality of adders and a plurality of delay elements for combining said second and third indications to produce a first sum bit and a carry bit and for combining said first indication and any carry bit from the combination of said second and third indications to produce a second sum bit.

15. The analog to digital converter of claim 11, wherein:
said first value is said upper reference voltage; and
said second value is said predetermined fraction of said upper reference voltage.

16. The method of claim 15, additionally comprising:
combining said fifth indication with said fourth indication to produce a third sum bit and a second carry bit; and
combining said second carry bit with said first sum bit to produce a fourth sum bit and a third carry bit; and
combining said second sum bit with said third carry bit to produce a fifth sum bit.

17. An analog to digital converter comprising:
a system input terminal;
a signal sampler having an input terminal connected to said system input terminal, and having an output terminal;
a tri-state comparator having an input terminal connected to said signal sampler, and additionally having first and second output terminals, wherein:
said comparator produces a first indication on said first output terminal if a signal on its input terminal exceeds an upper reference voltage; and
said comparator produces a second indication on said second output terminal if said signal on its input terminal exceeds a lower reference voltage and said comparator does not produce said first indication;
a subtractor connected to said signal sampler and to said comparator for subtracting from a signal output by said signal sampler a first value if said comparator produces said first indication, or a second value if said comparator produces said second indication;
a multiplier having an input terminal connected to the output of said subtractor and having an output terminal connected to the input terminal of said comparator; and
an accumulator comprising:
a first flip flop having an input terminal connected to said second output terminal and having an output terminal;
a first adder having input terminals connected to said first output terminal and the output terminal of said first flip flop and having a sum terminal and a carry terminal;
a second flip flop having an input terminal connected to the sum terminal of said first adder and having an output terminal;
a second adder having input terminals connected to the output terminal of said second flip flop and to the carry terminal of said first adder, and having a sum terminal and a carry terminal;
a third flip flop having an input terminal connected to the sum terminal of said second adder, and an output terminal; and
a third adder having input terminals connected to the output terminal of said third flip flop and to the carry terminal of said second adder, and having a sum terminal.

18. The analog to digital converter of claim 17, wherein said accumulator additionally comprises a fourth flip flop having an input terminal connected to the sum terminal of said third adder.

19. A method of converting an input analog signal to a digital signal, comprising:
sampling the input analog signal to produce an input signal sample;
producing a first full bit signal if said input signal sample is above an upper reference voltage;
producing a first half bit signal if said input signal sample is above a lower reference voltage and below said upper reference voltage;
subtracting from said input sample said upper reference voltage if said full bit signal is produced, and subtracting from said input sample said lower reference voltage if said half bit signal is produced, to produce a reduced signal sample;
doubling said reduced signal sample;
producing a second full bit signal if said doubled reduced signal sample is above said upper reference voltage;
producing a second half bit signal if said doubled reduced signal sample is above said lower reference voltage and below said upper reference voltage; and
accumulating said first and second full bit signals and said first and second half bit signals.

20. The method of claim 19 wherein said step of accumulating said bit signals comprises:
adding said second full bit signal and said first half bit signal to produce a first sum bit and a first carry bit; and
adding said first full bit signal and said first carry bit to produce a second sum bit.

21. The method of claim 20 additionally comprising:
subtracting from said doubled reduced signal sample said upper reference voltage if said second full bit signal is produced and subtracting from said reduced signal sample said lower reference voltage if said second half bit signal is produced, to produce a second reduced signal sample;
doubling said second reduced signal sample;
producing a third full bit signal if said doubled second reduced signal sample is above said upper reference voltage;
producing a third half bit signal if said doubled second reduced signal sample is above said lower reference voltage and below said upper reference voltage; and
combining said third full bit and half bit signals with said first and second full bit and half bit signals.

22. The method of claim 21 wherein said step of combining said third full bit and half bit signals with said first and second full bit and half bit signals comprises:
adding said third full bit signal and said second half bit signal to produce a third sum bit and a third carry bit;
adding said first sum bit and said third carry bit to produce a fourth sum bit and a fourth carry bit; and adding said second sum bit and said fourth carry bit to produce a fifth sum bit.

23. An analog to digital converter comprising:
a system input terminal for receiving an analog input signal;
a signal sampler having an input terminal connected to said system input terminal;
a comparator having an input terminal connected to said signal sampler, and having a full bit terminal and a half bit terminal, wherein:
said comparator produces a bit on said full bit terminal if a signal on its input terminal exceeds an upper reference voltage; and
said comparator produces a bit on said half bit terminal if said signal on its input terminal exceeds a lower reference voltage but does not exceed said upper reference voltage; a subtractor connected to said signal sampler and to said full and half bit terminals for subtracting from a signal output by said signal sampler said upper reference voltage if said comparator produces a bit on said full bit terminal, or said lower reference voltage if said comparator produces a bit on said half bit terminal;
a multiplier having an input terminal connected to said subtractor for doubling a signal output by said subtractor, and having an output terminal connected to said comparator input terminal;
a first delay element having an input terminal connected to said half bit terminal, and having an output terminal;
a first adder having input terminals connected to the output terminal of said first delay element and to said full bit terminal, and having a sum terminal and a carry terminal;
a second delay element having an input terminal connected to said sum terminal of said first adder, and having an output terminal;
a second adder having input terminals connected to the output terminal of said second delay element and to the carry terminal of said first adder, and having a sum terminal and a carry terminal;
a third delay element having an input terminal connected to the sum terminal of said second adder, and having an output terminal;
a third adder having input terminals connected to the carry terminal of said second adder and to the output terminal of said third delay element, and having a sum terminal.

24. The analog to digital converter of claim 23 wherein said comparator comprises:
a first comparator having an input terminal connected to said signal sampler and having an output terminal connected to said full bit terminal, for producing a bit if a signal on its input terminal exceeds said upper reference voltage;
a second comparator having an input terminal connected to said signal sampler and having an output terminal, for producing a bit if a signal on its input terminal exceeds said lower reference voltage; and
logic connected to said output terminals of said first and second comparators and to said half bit terminal for producing a bit on said half bit terminal if said second comparator produces a bit and said first comparator does not produce a bit.

25. The analog to digital converter of claim 24 wherein said logic comprises:

an inverter having an input terminal connected to the output terminal of said first comparator, and having an output terminal;
an AND gate having input terminals connected to the output terminal of said inverter and to the output terminal of said second comparator.

26. An analog to digital converter comprising:
a system input terminal for receiving an analog input signal;
a signal sampler having an input terminal connected to said system input terminal;
a first comparator having an input terminal connected to said signal sampler, and having a full bit terminal and a half bit terminal, wherein:
said comparator produces a bit on said full bit terminal if a signal on its input terminal exceeds an upper reference voltage; and
said comparator produces a bit on said half bit terminal if said signal on its input terminal exceeds a lower reference voltage but does not exceed said upper reference voltage;
a first subtractor connected to said signal sampler and to said full and half bit terminals of said first comparator for subtracting from a signal output by said signal sampler said upper reference voltage if said first comparator produces a bit on said full bit terminal, or said lower reference voltage if said first comparator produces a bit on said half bit terminal;
a first multiplier having an input terminal connected to said first subtractor for doubling a signal output by said first subtractor;
a second comparator having an input terminal connected to said first multiplier, and having a full bit terminal and a half bit terminal, wherein:
said second comparator produces a bit on said full bit terminal if a signal on its input terminal exceeds an upper reference voltage; and
said second comparator produces a bit on said half bit terminal if said signal on its input terminal exceeds a lower reference voltage but does not exceed said upper reference voltage;
a second subtractor connected to said first multiplier and to said full and half bit terminals of said second comparator for subtracting from a signal output by said multiplier said upper reference voltage if said comparator produces a bit on said full bit terminal, or said lower reference voltage if said comparator produces a bit on said half bit terminal;
a second multiplier having an input terminal connected to said second subtractor for doubling a signal output by said second subtractor;
a third comparator having an input terminal connected to said second multiplier, and having a full bit terminal and a half bit terminal, wherein:
said third comparator produces a bit on said full bit terminal if a signal on its input terminal exceeds an upper reference voltage; and
said third comparator produces a bit on said half bit terminal if said signal on its input terminal exceeds a lower reference voltage but does not exceed said upper reference voltage;
a third subtractor connected to said second multiplier and to said full and half bit terminals of said third comparator for subtracting from a signal output by said second multiplier said upper reference voltage if said comparator produces a bit on said full bit terminal, or said lower reference voltage if said comparator produces a bit on said half bit terminal;

a third multiplier having an input terminal connected to said third subtractor for doubling a signal output by said third subtractor;

a first adder having input terminals connected to the full bit terminal of said third comparator and to the half bit terminal of said second comparator, and having a sum terminal and a carry terminal;

a second adder having input terminals connected to the full bit terminal of said second comparator and to the half bit terminal of said first comparator, and having a sum terminal and a carry terminal;

a third adder having input terminals connected to the sum terminal of said second adder and to the carry terminal of said first adder, and having a sum terminal and a carry terminal;

a fourth adder having input terminals connected to the full bit terminal of said first comparator and to the carry terminal of said second adder, and having a sum terminal and a carry terminal; and a fifth adder having input terminals connected to the sum terminal of said fourth adder and to the carry terminal of said third adder, and having a sum terminal.

27. The analog to digital converter of claim 26, additionally comprising a plurality of delay elements, one of which is connected in each of the following positions:

between the half bit terminal of said second comparator and said first adder;

between the sum terminal of said second adder and said third adder;

between the sum terminal of said fourth adder and said fifth adder; and between the half bit terminal of said first comparator and said second adder; and said converter further includes a double time delay element connected between the full bit terminal of said first comparator and said fourth adder.

28. The analog to digital converter of claim 27 wherein each of said comparators comprises:

a first comparator having an input terminal connected to said signal sampler and having an output terminal connected to said full bit terminal, for producing a bit if a signal on its input terminal exceeds said upper reference voltage;

a second comparator having an input terminal connected to said signal sampler and having an output terminal for producing a bit if a signal on its input terminal exceeds said lower reference voltage but does not exceed said upper reference voltage; and logic connected to said output terminals of said first and second comparators and to said half bit terminal for producing a bit on said half bit terminal if said second comparator produces a bit and said first comparator does not produce a bit.

29. The analog to digital converter of claim 28 wherein said logic comprises:

an inverter having an input terminal connected to the output terminal of said first comparator and having an output terminal;

an AND gate having input terminals connected to the output terminal of said inverter and to the output terminal of said second comparator.

* * * * *